United States Patent [19]
Charvet et al.

[11] Patent Number: 6,051,071
[45] Date of Patent: Apr. 18, 2000

[54] DEVICE FOR EXTRACTING GAS FROM AN OVEN FOR CHEMICAL VAPOR DEPOSITION OR INFILTRATION IN AN INSTALLATION FOR FABRICATING COMPOSITE MATERIAL PARTS

[75] Inventors: Jean-Luc Charvet, Hastignan; Stéphane Goujard, Merignac, both of France

[73] Assignee: Societe Nationale d'Etude et de Construction de Moteurs d'Aviation, Paris, France

[21] Appl. No.: 08/849,623

[22] PCT Filed: Dec. 1, 1995

[86] PCT No.: PCT/FR95/01587

§ 371 Date: Jun. 4, 1997

§ 102(e) Date: Jun. 4, 1997

[87] PCT Pub. No.: WO96/17972

PCT Pub. Date: Jun. 13, 1996

[30] Foreign Application Priority Data

Dec. 5, 1994 [FR] France .................................. 94 14584

[51] Int. Cl.⁷ .................................................. C23C 16/00
[52] U.S. Cl. .............................. 118/715; 96/323; 96/325; 96/328; 261/76; 261/78.1; 261/118; 261/DIG. 54
[58] Field of Search ..................... 118/715; 261/DIG. 54, 261/76, 78.1, 118; 96/322, 327, 328, 325, 323

[56] References Cited

U.S. PATENT DOCUMENTS

| | | | |
|---|---|---|---|
| 4,185,025 | 1/1980 | Carduck et al. | 260/406 |
| 4,312,646 | 1/1982 | Fattinger et al. | 261/DIG. 54 |
| 4,469,493 | 9/1984 | Tuovinen et al. | 261/DIG. 54 |
| 4,603,035 | 7/1986 | Connell et al. | 261/DIG. 54 |

(List continued on next page.)

FOREIGN PATENT DOCUMENTS

| | | |
|---|---|---|
| 1363965 | 8/1974 | United Kingdom . |
| 1416194 | 12/1975 | United Kingdom . |
| 1464638 | 2/1977 | United Kingdom . |

(List continued on next page.)

OTHER PUBLICATIONS

Patent Abstracts of Japan, vol. 8, No. 145 (C–232), Jul. 6, 1984 and JP–A–59 050165 (Sony KK), Mar. 23, 1984.
Patent Abstracts of Japan, vol. 9, No. 56 (E–302), Mar. 12, 1985 and JP–A–59 197141 (Sony KK), Nov. 8, 1984.
Patent Abstracts of Japan, vol. 10, No. 172 (C–354) [2228], Jun. 18, 1986 and JP–A–61 023758 (Toshiba KK), Feb. 1, 1986.
Patent Abstracts of Japan, vol. 6, No. 177 (C–124), Sep. 11, 1982 and JP–A–57 094323 (Stanley Electric Co., Ltd.), Jun. 11, 1982.

(List continued on next page.)

*Primary Examiner*—Jan H. Silbaugh
*Assistant Examiner*—Dae Young Lee
*Attorney, Agent, or Firm*—Weingarten, Schurgin, Gagnebin & Hayes LLP

[57] ABSTRACT

A dry pump (32) has an inlet connected to the oven (10) for the purpose of establishing the desired low pressure conditions inside the oven and for extracting residual gas therefrom, a hydrolysis reactor (50) is connected to an outlet of the dry pump in order to receive residual gases coming from the oven, the hydrolysis reactor includes a first outlet (52) for solid deposits or for acid solutions coming from hydrolysis of the gases it receives, and it has a second outlet (54) for gas which is connected to the atmosphere. Gas injection means (46, 48) are located between the inlet of the dry pump (32) and the hydrolysis reactor (50) to prevent any backflow from the hydrolysis reactor towards the pump. Water feed means (74, 76) are connected to the hydrolysis reactor (50), at least via the second outlet (54) thereof, in order to put into solution the acid vapors that come from the hydrolysis reactor, thereby avoiding discharging them in the atmosphere.

7 Claims, 1 Drawing Sheet

U.S. PATENT DOCUMENTS

| | | | |
|---|---|---|---|
| 4,823,734 | 4/1989 | Christin | 118/719 |
| 5,110,438 | 5/1992 | Ohmi et al. | 204/298.34 |
| 5,380,370 | 1/1995 | Niino et al. | 134/22.11 |
| 5,738,908 | 4/1998 | Rey et al. | 427/249 |

FOREIGN PATENT DOCUMENTS

| | | |
|---|---|---|
| 1531918 | 11/1978 | United Kingdom . |
| 1593534 | 7/1981 | United Kingdom . |
| 2133422A | 7/1984 | United Kingdom . |
| WO 8704733 | 8/1987 | WIPO . |

OTHER PUBLICATIONS

"Safety Procedures Used During the Manufacturing of Amorphous Silicon Solar Cells", C.R. Dickson, Seri Photovoltaics Safety Conference, Lakewood, Colorado, USA, Jan. 16–17, 1986, vol. 9, No. 3–4, ISSN 0379–6787, Solar Cells, Jan. 1987, Switzerland, pp. 189–201.

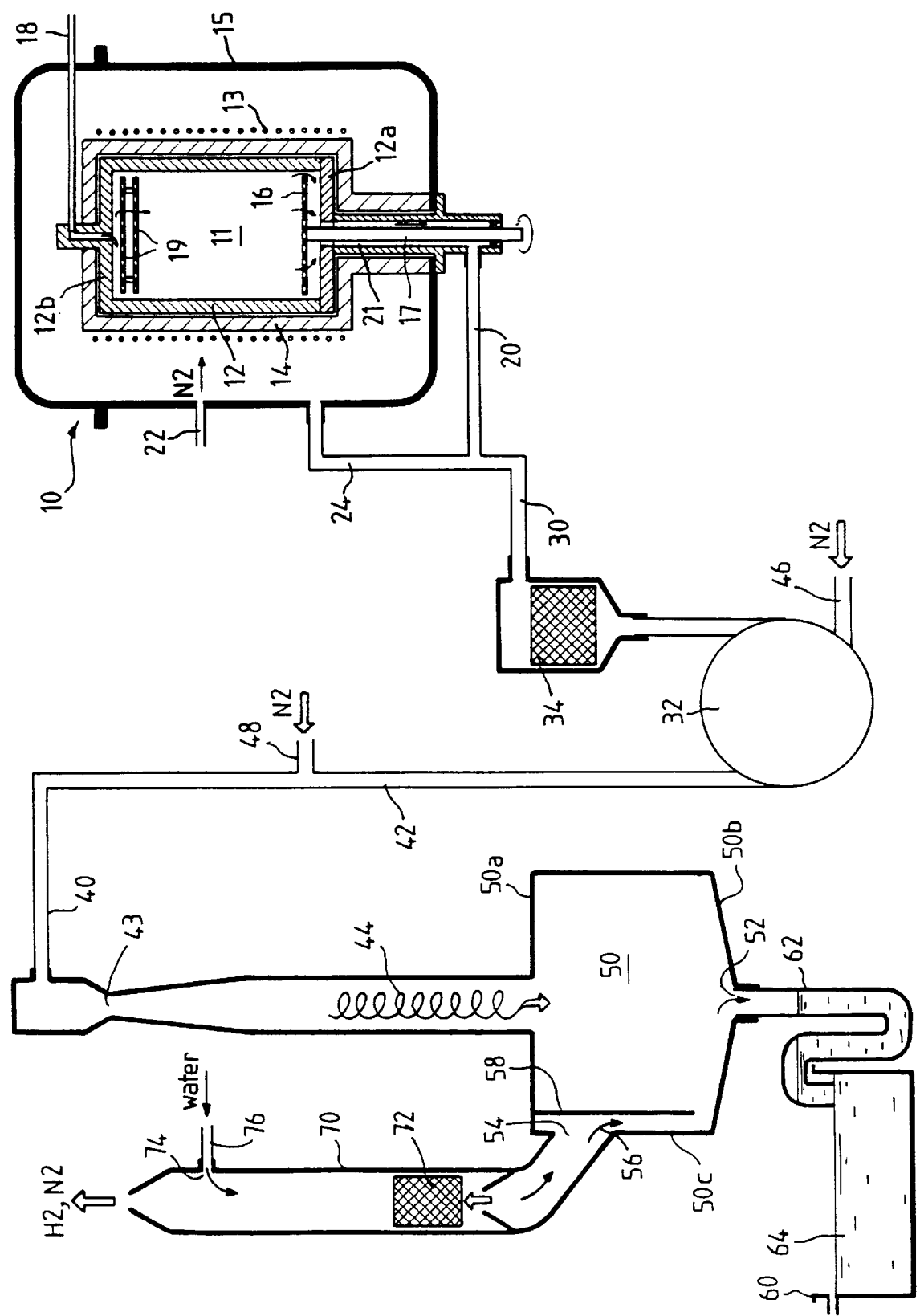

DEVICE FOR EXTRACTING GAS FROM AN OVEN FOR CHEMICAL VAPOR DEPOSITION OR INFILTRATION IN AN INSTALLATION FOR FABRICATING COMPOSITE MATERIAL PARTS

FIELD OF THE INVENTION

The present invention relates to industrial installations for fabricating composite material parts, which installations include ovens for chemical vapor deposition or infiltration. More particularly, the invention relates to a gas extraction device for such installations.

BACKGROUND OF THE INVENTION

A known technique for fabricating composite material parts, in particular parts made of thermostructural composite materials such as carbon-carbon composites or ceramic matrix composites, consists in making preforms of the parts and in densifying the preforms in a chemical vapor deposition or infiltration oven. Preforms for parts are generally constituted by fibrous textures or fabrics. The preforms, optionally held in shape by tooling, are inserted into an oven into which there is admitted a gas whose composition is selected as a function of the nature of the matrix of the composite material. Under predetermined conditions of temperature and pressure, the gas diffuses throughout the pores in the preforms and, by decomposition of one of its components or by reaction between a plurality of its components, it leaves behind a solid deposit that progressively densifies the preforms by filling up their pores and thus forming the matrix.

Since chemical vapor deposition or infiltration takes place under low pressure, it is necessary to provide pumping means connected to the oven. An industrial installation for chemical vapor infiltration and operating with a water ring pump is described in document WO 87/04733.

The gaseous reaction products and/or the residues of the gas as extracted from the oven by pumping may give rise to difficulties because they are toxic or corrosive, or because they tend to form unwanted deposits.

This applies in particular when fabricating parts made of composite materials in which the matrices are at least mainly constituted by a ceramic such as a silicon carbide (e.g. SiC), or, more particularly, when the matrix includes at least one ceramic such as boron carbide ($B_4C$) or a silicon-boron-carbon (Si—B—C) ternary system as described in document EP-A-0 483 009.

The precursors used in the gas then generally include gaseous halides, in particular gaseous chlorides, which, in addition to being corrosive and toxic, can also form considerable solid deposits on leaving the oven. This applies in particular to boron trichloride $BCl_3$, a precursor for the element boron.

In the above-mentioned installation that uses a water ring pump, it has thus been observed by the Applicant that the presence of moisture at the inlet to the pump gives rise to solid deposits because of reaction with the gaseous chlorides, thereby progressively and inescapably clogging the pumping pipework. It is then necessary to perform frequent maintenance, or indeed replacement, of the components in the pumping device, which operations require great precautions to be taken because of the unwanted solid deposits are frequently of an unstable nature.

SUMMARY OF THE INVENTION

Thus, an object of the present invention is to provide a gas extraction device which avoids the abovementioned drawbacks, in particular which avoids unwanted deposited forming that could give rise to clogging. Another object of the present invention is to provide an extraction device including means for treating corrosive and toxic gases coming from the oven prior to discharging them to the atmosphere.

This object is achieved by a gas extraction device comprising a dry pump having an inlet connected to the oven to enable the desired low pressure conditions to be established inside the oven and to enable residual gases to be extracted therefrom; and a hydrolysis reactor connected to an outlet of the dry pump and designed to receive the residual gases coming from the oven, the hydrolysis reactor having a first outlet for solid deposits or acid solutions coming from hydrolysis of the gases it receives, and a second outlet for gas that is connected to the atmosphere.

Advantageously, means are provided for injecting a gas, preferably an inert gas such as nitrogen, between the inlet of the dry pump and the inlet of the hydrolysis reactor. The gas injection may be performed both at the inlet of the dry pump and into a duct connecting the dry pump to the hydrolysis reactor. In addition to having a diluting effect on the gases extracted from the oven, such gas injection contributes to opposing backflow from the hydrolysis reactor to the pump, thereby avoiding any return of hydrolysis reaction products towards the pump.

Water feed means are advantageously provided to establish a continuous flow of liquid between at least one access to the hydrolysis reactor and the first outlet thereof.

The water feed means are preferably connected to the hydrolysis reactor via at least the second outlet thereof so as to make it possible to put the acid vapors that come from the reactor into solution, thereby avoiding discharging them in the atmosphere. To this end, the water feed means may be connected to a water injection inlet of a column connected to the second outlet of the reactor.

Also for avoiding discharge of toxic or corrosive substances, the first outlet of the hydrolysis reactor may be connected to a neutralization tank for the purpose of neutralizing the acid solutions produced by hydrolysis.

BRIEF DESCRIPTION OF THE DRAWINGS

A particular embodiment of the invention is described below by way of non-limiting indication with reference to the accompanying drawing in which the sole figure is a highly diagrammatic overall view of a gas extraction device in accordance with the invention.

DETAILED DESCRIPTION OF THE INVENTION

The gas extraction device shown is connected to the outlet of a chemical vapor infiltration oven 10, e.g. as described in above-mentioned document WO 87/04733. Very briefly, the oven 10 comprises a reaction chamber 11 defined by a graphite induction body 12. The induction body is surrounded by a metal inductor 13 with heat insulation 14 being interposed therebetween. The assembly is housed inside a gastight metal enclosure 15.

The induction body 12 is in the form of a cylinder about a vertical axis that is closed at its bottom end by a bottom 12a and at its top end by a removable cover 12b. Inside the chamber 11, preforms to be densified are placed on a perforated turntable 16. The preforms (not shown) may be fiber-based structures that are close in shape to the shapes of the parts to be made out of composite material, and they may optionally be held in tooling. The turntable 16 is capable of rotating about a vertical axis coinciding with that of the chamber 11. Rotation is under the control of a motor (not shown) coupled to the turntable by a shaft 17 passing through the bottom 12*a*.

Reaction gas containing the precursor(s) for the matrix of the composite material and taken from supplies thereof (not shown) is injected into the chamber 11 via a feed duct 18 passing through the enclosure 15 and opening out into the top portion of the chamber through the cover 12*b*. An additional flow of inert gas, e.g. nitrogen, may be added to the reaction gas in order to adjust the pressure inside the chamber. The reaction gas that penetrates into the chamber 12 is made to flow in contact with preheating plates. These plates as constituted by superposed perforated plates 19 make it possible to raise the temperature of the reaction gas quickly to the temperature inside the chamber.

Residual gas is extracted through one or more ducts 20 connected to the bottom portion of the chamber 11 via an annular passage 21 surrounding the shaft 17.

The volume situated around the induction body 12 inside the enclosure 11 is continuously swept by an inert gas, such as nitrogen. This gas is fed via a duct 22. It is extracted from the enclosure 15 by a duct 24. A buffer of inert gas is thus formed around the chamber 11.

Outside the chamber, the ducts 20 and 24 are connected together so as to form a single duct 30.

In conventional manner, a control unit (not shown) receives signals representative of the temperature and the pressure inside the chamber 11, and controls a generator (not shown) which supplies feed current to the inductor so as to maintain the temperature inside the chamber at the predetermined optimum value for chemical vapor infiltration.

As mentioned above, the preforms contained in the infiltration oven are densified with a ceramic matrix, in particular a matrix formed at least in part from the ternary Si—B—C system, including SiC, $B_4C$, and $SiB_4$, and the densification makes use of precursors contained in the gas and constituted by gases which are toxic, corrosive, and liable to form unwanted deposits on leaving the oven 10. These precursor gases are constituted, in particular, by gaseous chlorides such as $Si_xH_yCl_z$ or $B_tH_uCl_v$ (where x, y, z, t, u and v are integers).

According to a feature of the device of the invention, gas is extracted from the oven by means of a dry pump 32 connected to the oven 10 via a duct under the control of the control unit of the installation. The term "dry pump" is used herein to designate a pump which, in operation, makes use of no liquid such as oil or water that might react with the gases coming from the oven to form unwanted deposits. By way of example, it is possible to use a pump as sold by Edwards under the name Dry Pump DP180. That pump provides the additional advantage of having an operating temperature that can be adjusted up to 160° C., thereby making it possible to select an operating temperature that avoids any phenomenon of recondensation taking place within the pump body. A filter 34 may be mounted in the duct 30 in order to retain solid particles of a size exceeding a threshold preferably lying in the range 10 microns to 15 microns. By way of example, the filter 34 may be constituted by a rolled-up fine mesh of stainless steel, such as the ITF cyclone effect filter sold by Edwards.

Means are provided downstream from the pump for treating the gases extracted thereby in order to avoid pumping toxic and corrosive gases into the atmosphere and in order to avoid unwanted deposits forming at the outlet from the pump.

The processing means comprise a hydrolysis reactor 50 connected to the outlet of the pump 32 by a duct 40. The gases coming from the pump reach the reactor by following a rising path along a first portion 42 of the duct 40 and then following a falling path, initially through a gas jet venturi 43 and then along a tube 44 into which a helix is inserted and forming the end vertical portion of the duct 40. The tube 44 terminates at the top of the hydrolysis tank 50, passing through a cover 50*a*.

The acid solutions and solid deposits produced by hydrolyzing the residual gases extracted by the pump are evacuated through an outlet 52 that leads into the bottom 50*b* of the hydrolysis reactor. The outlet 52 is connected to a neutralization tank 60 via a duct 62. The tank 60 contains a bath 64 suitable for neutralizing the acid solutions conveyed thereto by the duct 62.

An inert gas, e.g. nitrogen, is injected into the circuit of the gases extracted from the oven, firstly at the inlet to the pump 32 via a duct 46, and secondly via a duct 48 into the portion 42 of the connection between the pump and the hydrolysis reactor, upstream from the venturi 43.

The effect of injecting nitrogen is to dilute the gas at the inlet to the pump 32 and to oppose any return of acid vapor or solid particles from the hydrolysis reactor 50 back towards the pump, thereby avoiding any clogging of the pump outlet. The venturi 43 and the tube 44 constituting that portion of the duct 42 which terminates at the hydrolysis reactor and in which the gas flows downwards, reinforce the function of providing an interface between the pump 32 and the hydrolysis reactor 50 as provided by injection nitrogen.

The hydrolysis reactor 50 has a gas outlet 54 communicating with the atmosphere via a plate column 70. A filter 72, e.g. constituted by "Rashig" rings is inserted in the column 70. A water injection inlet 74 is provided in the column 70 in the top portion thereof, and it communicates with a supply of water (not shown) via a duct 76. The water injected in this way creates a mist in the column and it penetrates into the hydrolysis reactor 50 through its outlet 54, forming a water curtain 56. This water flows into a zone of the hydrolysis reactor that is defined by the lateral wall 50*c* where the outlet 54 is formed and a partition 58 parallel to the wall 50*c* and extending over the major portion of the height of the hydrolysis reactor 50 from the cover 50*a*. As a result, any acid vapor that may be entrained out from the reactor 50 through its outlet 54 is dissolved and is returned to the reactor for evacuation via the outlet 52.

In the example mentioned above where the infiltration oven 10 is fed with gas containing precursors for SiC or for a ternary Si—B—C system or for $B_4C$, the gaseous chlorides $Si_xH_yCl_z$ or $B_tH_uCl_v$ are transformed in the hydrolysis reactor into a solution of hydrochloric acid and into solid oxides $SiO_2$ and $B_2O_3$, with hydrogen being released. The gases discharged into the atmosphere from the top of the column 70 are then constituted in practice by gaseous hydrogen and by the nitrogen injected into the extraction device.

We claim:

1. An industrial installation for fabricating parts made of composite material, the installation comprising:

a chemical vapor deposition or chemical vapor infiltration oven;

and a device for extracting gas from the oven comprising a dry pump having an inlet connected to the oven to enable desired low pressure conditions to be established inside the oven and to enable residual gases to be extracted therefrom, and a hydrolysis reactor connected to an outlet of the dry pump and designed to receive the residual gases coming from the oven, the hydrolysis reactor comprising a first outlet for solid deposits or acid solutions coming from hydrolysis of the gases received by the hydrolysis reactor, a second outlet for gas that is connected to atmosphere, and water feed means enabling continuous liquid circulation to be provided at least between one access to the hydrolysis reactor and the first outlet thereof.

2. An installation according to claim 1, further comprising gas injection means between the inlet to the dry pump and the hydrolysis reactor in order to avoid any backflow from the hydrolysis reactor towards the pump.

3. An installation according to claim 2, wherein the gas injection means are connected firstly to the dry pump and secondly to a duct connecting the dry pump to the hydrolysis reactor.

4. An installation according to claim 1, wherein the water feed means are connected to the hydrolysis reactor at least via the second outlet thereof in order to put into solution acid vapors coming from the hydrolysis reactor and to avoid discharging the acid vapors into the atmosphere.

5. An installation according to claim 4, wherein the water feed means comprises water injection means inside a column connected to the second outlet of the hydrolysis reactor.

6. An installation according to claim 1, further comprising a neutralizing tank connected to the first outlet of the hydrolysis reactor.

7. An installation according to claim 2, further comprising a neutralizing tank connected to the first outlet of the hydrolysis reactor.

* * * * *